(12) United States Patent
Megrant

(10) Patent No.: US 10,403,808 B2
(45) Date of Patent: Sep. 3, 2019

(54) FABRICATION OF INTERLAYER DIELECTRICS WITH HIGH QUALITY INTERFACES FOR QUANTUM COMPUTING DEVICES

(71) Applicant: Google LLC, Mountain View, CA (US)

(72) Inventor: Anthony Edward Megrant, Goleta, CA (US)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 16/066,640

(22) PCT Filed: Dec. 30, 2015

(86) PCT No.: PCT/US2015/068130
§ 371 (c)(1),
(2) Date: Jun. 27, 2018

(87) PCT Pub. No.: WO2017/116442
PCT Pub. Date: Jul. 6, 2017

(65) Prior Publication Data
US 2019/0027672 A1    Jan. 24, 2019

(51) Int. Cl.
*H01L 39/24* (2006.01)
*H01L 39/02* (2006.01)
*G06N 10/00* (2019.01)

(52) U.S. Cl.
CPC ............. *H01L 39/24* (2013.01); *G06N 10/00* (2019.01); *H01L 39/02* (2013.01)

(58) Field of Classification Search
CPC .............................. H01L 39/24; H01L 39/02
See application file for complete search history.

(56) References Cited

U.S. PATENT DOCUMENTS

| | | |
|---|---|---|
| 6,479,139 B1 | 11/2002 | Claeson et al. |
| 2014/0264286 A1 | 9/2014 | Chang et al. |
| 2014/0274725 A1 | 9/2014 | Abraham et al. |
| 2015/0357089 A1 | 12/2015 | Oh et al. |

OTHER PUBLICATIONS

International Search Report and Written Opinion for International Application No. PCT/US2015/068130, dated Sep. 27, 2016.

(Continued)

*Primary Examiner* — Errol V Fernandes
(74) *Attorney, Agent, or Firm* — Fish & Richardson P.C.

(57) ABSTRACT

A method includes: providing a first wafer including a first substrate, a first insulator layer on the first substrate, and a first dielectric layer on the first insulator layer; providing a second wafer including a second substrate, a second insulator layer on the second substrate, and a second dielectric layer on the second insulator layer; forming a first superconductor layer on the first dielectric layer; forming a second superconductor layer on the second dielectric layer; joining a surface of the first superconductor layer to a surface of the second superconductor layer to form a wafer stack; and forming a third superconductor layer on exposed first surface of the first dielectric layer.

27 Claims, 8 Drawing Sheets

(56) References Cited

OTHER PUBLICATIONS

'www.mhi-global.com' [online] "Room Temperature Wafer Bonding machine Bond Meister," Available on or before Aug. 15, 2014 via the Wayback Internet Archive, [retrieved Dec. 2, 2015] Retrieved from Internet: URL< https://www.mhi-global.com/products/detail/wafer_bonding_machine.html> 8 pages.
Barends et al. "Logic gates at the surface code threshold: Superconducting quibits poised for fault-tolerant quantum computing," arXiv 1402.4848, Feb. 19, 2014, 15 pages.
International Preliminary Report on Patentability issued in International Application No. PCT/US2015/068130, dated Jul. 12, 2018, 7 pages.
Kelly et al. "State preservation by repetitive error detection in a superconducting quantum circuit," Nature 519.7541, Mar. 2015, 30 pages.
Weber et al. "Single crystal silicon capacitors with low microwave loss in the single photon regime," arXiv 1102.2917v2, Apr. 19, 2011, 3 pages.
Wenner et al. Supplementary Material for 'Surface loss simulations of superconducting coplanar waveguide resonators', Applied Physics Letters, 99(11), 113513, Aug. 5, 2011, 4 pages.

FABRICATION OF INTERLAYER DIELECTRICS WITH HIGH QUALITY INTERFACES FOR QUANTUM COMPUTING DEVICES

CROSS-REFERENCE TO RELATED APPLICATIONS

This application claims priority to and is a U.S. National Phase under 371 of International Application No. PCT/US2015/068130, filed on Dec. 30, 2015, and is incorporated by reference in its entirety.

TECHNICAL FIELD

The present disclosure relates to fabrication of interlayer dielectrics with high quality interfaces for quantum computing devices.

BACKGROUND

Quantum computing is a relatively new computing method that takes advantage of quantum effects, such as superposition of basis states and entanglement to perform certain computations more efficiently than a classical digital computer. In contrast to a digital computer, which stores and manipulates information in the form of bits (e.g., a "1" or "0"), quantum computing systems can manipulate information using qubits. A qubit can refer to a quantum device that enables the superposition of multiple states (e.g., data in both the "0" and "1" state) and/or to the superposition of data, itself, in the multiple states. In accordance with conventional terminology, the superposition of a "0" and "1" state in a quantum system may be represented, e.g., as $\alpha|0\rangle + \beta|0\rangle$. The "0" and "1" states of a digital computer are analogous to the $|0\rangle$ and $|1\rangle$ basis states, respectively of a qubit. The value $|\alpha|^2$ represents the probability that a qubit is in $|0\rangle$ state, whereas the value $|\beta|^2$ represents the probability that a qubit is in the $|1\rangle$ basis state.

SUMMARY

In general, in some aspects, the subject matter of the present disclosure can be embodied in methods that include: providing a first wafer including a first substrate, a first insulator layer on the first substrate, and a first dielectric layer on the first insulator layer; providing a second wafer including a second substrate, a second insulator layer on the second substrate, and a second dielectric layer on the second insulator layer; forming a first superconductor layer on the first dielectric layer; forming a second superconductor layer on the second dielectric layer; joining a surface of the first superconductor layer to (e.g., directly to) a surface of the second superconductor layer to form a wafer stack; and forming a third superconductor layer on a first surface of the first dielectric layer.

Implementations of the methods can include one or more of the following features. For example, in some implementations, joining the surface of the first superconductor layer to the surface of the second superconductor layer is performed under an ambient temperature less than approximately 150° C.

In some implementations, joining the surface of the first superconductor layer to the surface of the second superconductor layer is performed under an ambient temperature less than approximately 100° C.

In some implementations, joining the surface of the first superconductor layer to the surface of the second superconductor layer is performed under an ambient temperature between approximately 18° C. and approximately 30° C., or more particularly between approximately 18° C. and approximately 26° C.

In some implementations, the methods further include ion milling the surface of the first superconductor layer and the surface of the second superconductor layer prior to joining the surface of the first superconductor layer to the surface of the second superconductor layer.

In some implementations, joining the surface of the first superconductor layer to the surface of the second superconductor layer includes bonding the surface of the first superconductor layer to the surface of the second superconductor layer. The joining can be performed under a vacuum in the range of between approximately $10^{-7}$ Torr to approximately $10^{-9}$ Torr.

In some implementations, the methods include removing a portion of the first substrate by performing a dry etch of the first substrate. Performing the dry etch can include exposing the first substrate to a $SF_6$ or $XeF_2$ plasma, in which the first insulator layer serves as an etch stop for the dry etch.

In some implementations, the methods include removing a portion of the first substrate by performing a wet etch of the first substrate. Performing the wet etch can include exposing the first substrate to a solution comprising KOH, in which the first insulator layer serves as an etch stop for the wet etch.

In some implementations, the methods removing a portion of the first insulator layer from the wafer stack by performing a wet etch of the first insulator layer. Performing the wet etch of the first insulator layer can include exposing the first insulator layer to a solution comprising HF, in which the first dielectric layer serves as an etch stop for the wet etch.

In some implementations, the methods further include, prior to forming the first superconductor layer on the first dielectric layer, exposing a second surface of the first dielectric layer, opposite of the first surface of the first dielectric layer, to an $O_2$ plasma, and prior to forming the second superconductor layer on the second dielectric layer, exposing a first surface of the second dielectric layer to an $O_2$ plasma.

In some implementations, the methods further include removing a portion of the first substrate and the first insulator to expose the first surface of the first dielectric layer, and, prior to forming the third superconductor layer, applying an $O_2$ plasma to the exposed surface of the first dielectric layer.

In some implementations, the methods further include forming a through-hole that extends from the third superconductor layer to the first superconductor layer, and forming a superconductor interconnect in the through-hole that is in contact with the first superconductor layer and the third superconductor layer. Forming the through-hole can include performing a $SF_6$ etch of the first dielectric layer, in which the first superconductor layer serves as an etch stop for the $SF_6$ etch. Forming the superconductor interconnect in the through-hole can include depositing a superconductor material by electron-beam deposition or by physical vapor deposition.

In some implementations, each of the first wafer and the second wafer includes a silicon-on-insulator stack.

In some implementations, the first substrate includes a first single crystal silicon substrate, the first insulator layer includes a first $SiO_2$ layer or a first sapphire layer, and the first dielectric layer includes a first silicon layer, and the second substrate includes a second single crystal silicon substrate, the second insulator layer includes a second $SiO_2$ layer or a second sapphire layer, and the second dielectric layer includes a second silicon layer. The first silicon layer can be a first single crystal silicon layer, and the second silicon layer can be a second single crystal silicon layer.

In some implementations, the first superconductor layer includes a first aluminum layer, the second superconductor layer includes a second aluminum layer, and the third superconductor layer includes a third aluminum layer.

In some implementations, the third superconductor layer, the first dielectric layer, and the first superconductor layer form a parallel plate capacitor.

In some implementations, the third superconductor layer forms at least part of a quantum device. The quantum device can include a qubit.

In general, in some aspects, the subject matter of the present disclosure can be embodied in quantum devices that include: a dielectric layer having a first surface and a second surface opposite to the first surface; and a first superconductor layer in contact with the first surface of the dielectric, in which a loss tangent of an interface between the first surface of the dielectric and the first superconductor is less than or equal to a bulk loss tangent of the dielectric layer.

One or more implementations, embodiments, and/or aspects of the disclosure can have various advantages. For example, in some cases, the devices and/or methods disclosed herein can allow, in certain implementations, for greater connectivity among quantum devices and increases in quality factors associated with quantum devices, such as resonator devices. In some cases, the devices and/or methods provide a substantial reduction of crosstalk. In some cases, the devices and/or methods provide a reduction in surface loss at one or more interfaces.

The details of one or more embodiments are set forth in the accompanying drawings and the description below. Other features and advantages will be apparent from the description, drawings, and claims.

DETAILED DESCRIPTION

Figure 1A:
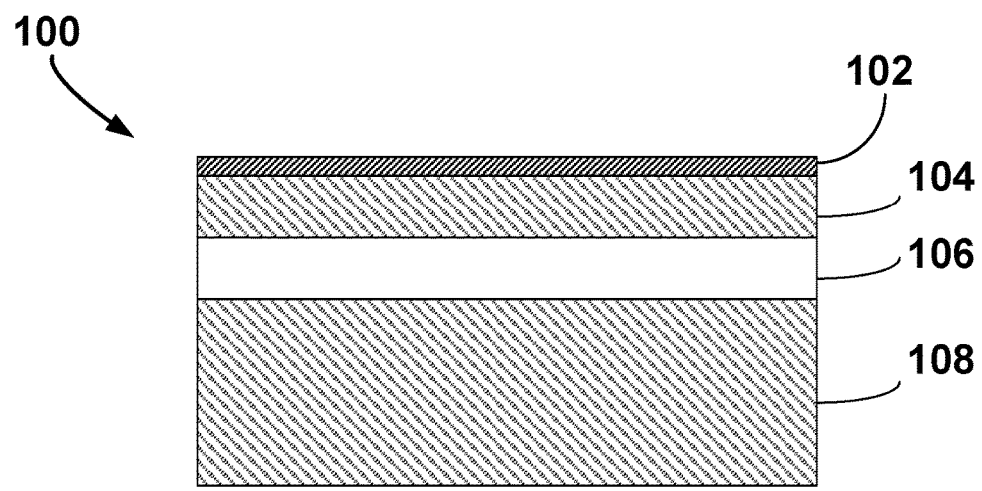
FIGS. 1A-1G are schematics illustrating an example process for fabricating interlayer dielectrics having interfaces associated with relatively high quality factor Q.

Quantum computing entails coherently processing quantum information stored in the qubits of a quantum computer. In certain types of quantum computing processors, such as quantum annealers, the qubits of the quantum processor are coupled together in a controllable manner such that the quantum state of each qubit affects the corresponding quantum states of the other qubits to which it is coupled. Depending on the processor design, the chosen architecture may limit the total number of qubits available for coupling, and thus limit the ability of the processor to perform complex problems requiring large numbers of qubits. Furthermore, in certain quantum computing designs, the qubits may suffer energy loss and decoherence due to interactions with two level systems. In quantum computers that use qubits formed from superconductor materials, such two level systems are typically found on the surfaces and interfaces of the materials used to fabricate the qubits and other components of the computers. To expand the number of qubits available for coupling in a solid state quantum processor, such as a quantum annealer having superconducting quantum devices, one approach is to construct the quantum devices within the processor using 3D integration. That is, instead of fabricating the qubits and other quantum devices of the processor within a single plane that extends along one and/or two dimensions (e.g., x- and/or y-directions), the quantum devices can also be formed in one or more layers extending into a third dimension (e.g., z-direction). 3D integration also allows, in certain implementations, for greater connectivity and increases in quality factors associated with resonator devices. Moreover, 3D integration can, in some cases, provide a substantial reduction of crosstalk, since multiple layers of ground planes can be used to isolate drivelines and undesired coupling to other qubits, among other sources of cross-talk.

Fabrication of integrated quantum devices with superconducting components typically involves depositing dielectrics and metal layers using, e.g., sputtering, electron beam evaporation, chemical vapor deposition, and/or atomic layer deposition, among other techniques. Formation of the integrated quantum devices can also entail patterning the deposited layers. However, superconducting circuits, such as qubits, inductance based photon detectors, and linear resonators rely on low loss reactive microwave components to achieve a high quality factor Q. The deposited dielectrics, which may be amorphous or polycrystalline, are typically very lossy compared to single crystal substrates (in some cases by many orders of magnitude). Therefore, such deposited dielectrics are not suitable for high coherence (low decoherence) superconducting quantum circuits.

An alternative to depositing poor quality dielectric materials is to introduce high quality single crystal dielectrics using wafer bonding. However, even single crystalline dielectrics can have high loss if care is not taken to ensure that the interfaces are of high quality as well. For example, assuming a simple parallel plate capacitor having a 10 µm thick single crystalline dielectric (bulk loss tangent of about $10^{-6}$ or less) between the plates and a lossy interface approximately 3 nm in thickness at both the top and bottom metal-dielectric interfaces, in which the loss tangent of the lossy layer is $2*10^{-3}$ (a reasonable approximation for lossy dielectrics), then the lossy interface stores (6 nm/10 µm=$6*10^{-4}$) of the total energy and the overall quality factor Q for the parallel plate is $1/((6*10^{-4})*(2*10^{-3}))=830,000$ for a microwave applied to the device in which the microwave has a frequency in the range of between approximately 4 GHz and approximately 8 GHz, such as between 4 GHz and approximately 6.5 GHz. This quality factor is substantially below that achievable with planar resonators, by approximately an order of magnitude, even if it is assumed there is zero loss from the high quality dielectric.

A factor that can contribute to the lossy interfaces of the single crystal dielectrics is the use of high temperatures (e.g., above approximately 150° C.) during processing, which can lead to, e.g., the formation of hillocks, voids, and/or diffusion of materials across the interface between dielectric and superconductor layers. Such losses are especially true in cases where Al is used as the superconductor material. Typical cleaning steps for surfaces of dielectrics use high temperatures (e.g., above approximately 150° C.). Additionally, wafer bonding may require high temperatures. When one or more layers of superconductor materials have already been deposited, any subsequent high temperature processing steps, such as cleaning or bonding, will allow the aforementioned interactions (hillock/void formation and diffusion) to take place. Although the losses from the interface can be reduced somewhat by making the single crystal dielectric thicker, the increase in dielectric thickness can complicate filling through-hole vias in the dielectric with interconnects (e.g., thicker dielectric layers can result in poor or no interconnection between layers due to limits of deposition techniques).

In general, in some aspects, the present disclosure encompasses methods for fabricating interlayer dielectrics, in which the interlayer dielectrics exhibit high quality/low loss interfaces suitable for use with quantum devices. The methods include providing a first wafer that includes a superconductor layer formed on a single crystal dielectric and a second wafer that also includes a superconductor layer formed on a single crystal dielectric and then joining (e.g., bonding) the superconductor layers of each wafer together at temperatures below approximately 150° C. By joining the superconductor layers at temperatures below approximately 150° C., the fabrication methods reduce diffusion and the formation of hillocks and voids between the dielectric and superconductor layers that can otherwise lead to lossy interfaces. Furthermore, the methods disclosed herein, including the joining (e.g., bonding) process and the pre-cleaning process performed prior to joining, can be performed without heat being added. For example, joining (e.g., bonding) the superconductor layers can be performed at an ambient temperature of the manufacturing facility in which the device is constructed, such as at room temperature (e.g., between approximately 18° C. and approximately 30° C.). By performing the pre-cleaning step and/or joining step without heat being added, losses associated with the use of heat can be reduced, resulting in a higher quality (e.g., having a lower loss tangent and a higher Q) interface once the superconductor layer is formed on the dielectric. Additionally, since wafers having high quality single crystal dielectrics are joined together, the structures resulting from the fabrication methods disclosed herein can be used as part of 3D integrated quantum circuits that exhibit low losses and that permit a substantial increase in the number of quantum devices (e.g., superconducting qubits) that can be used relative to integrated quantum circuits having a 2D or planar design.

Figure 1B:
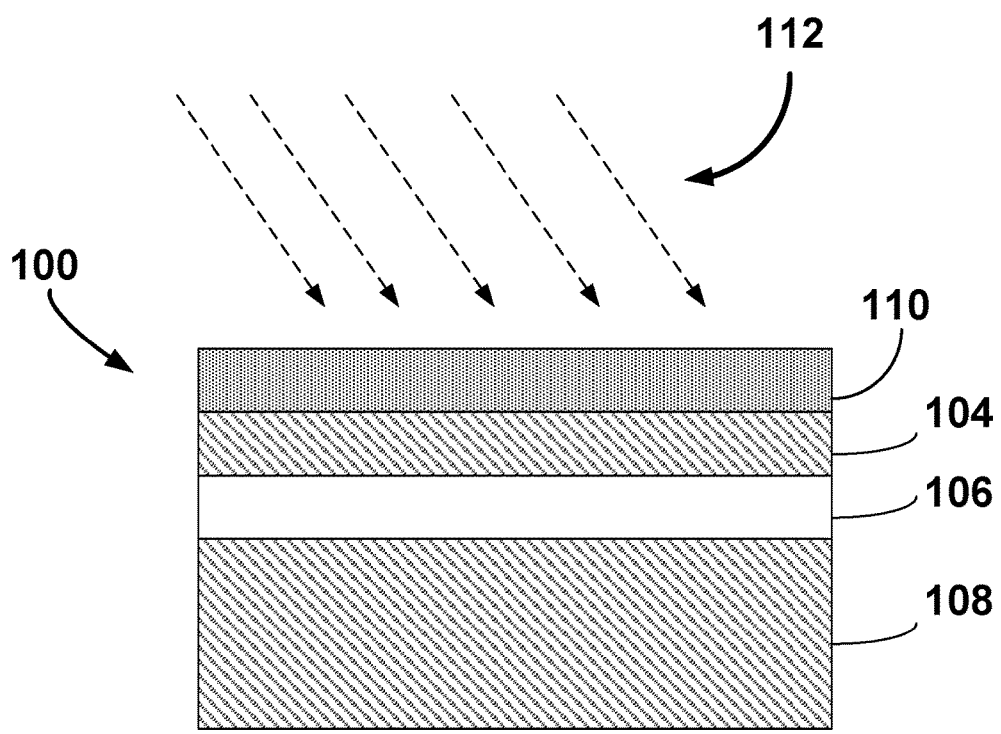
Figure 1C:
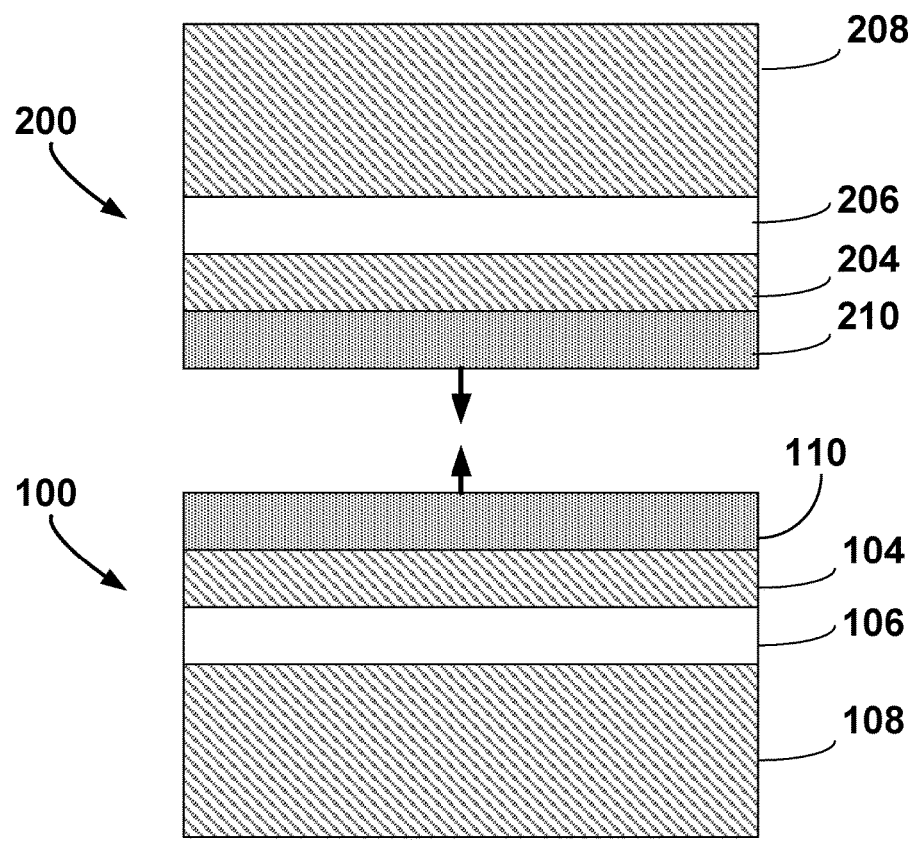
Figure 1D:
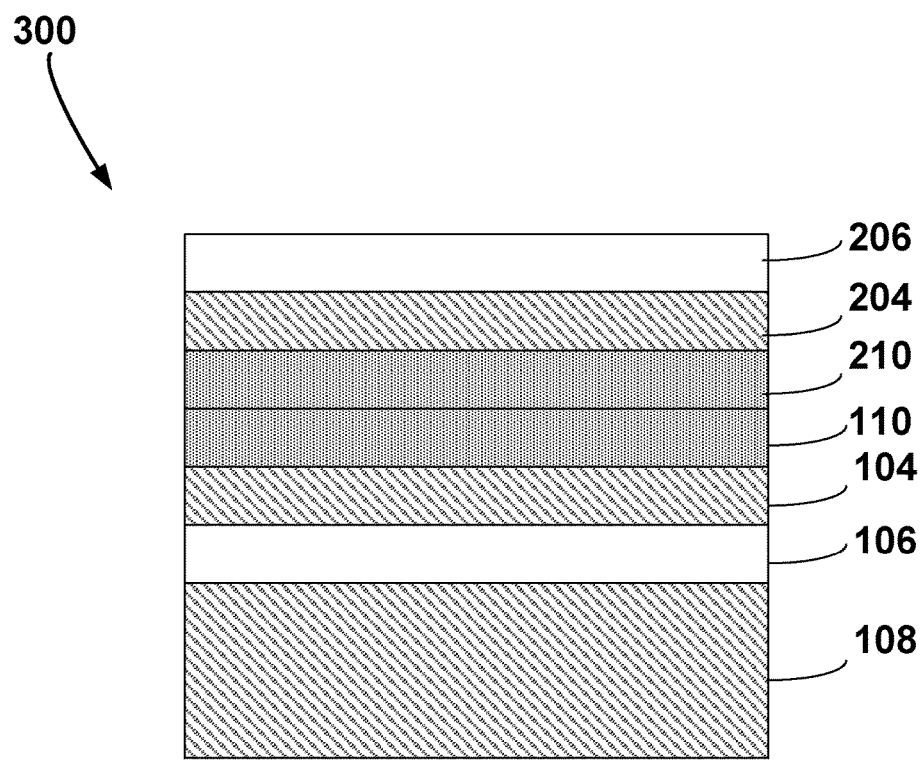
Figure 1E:
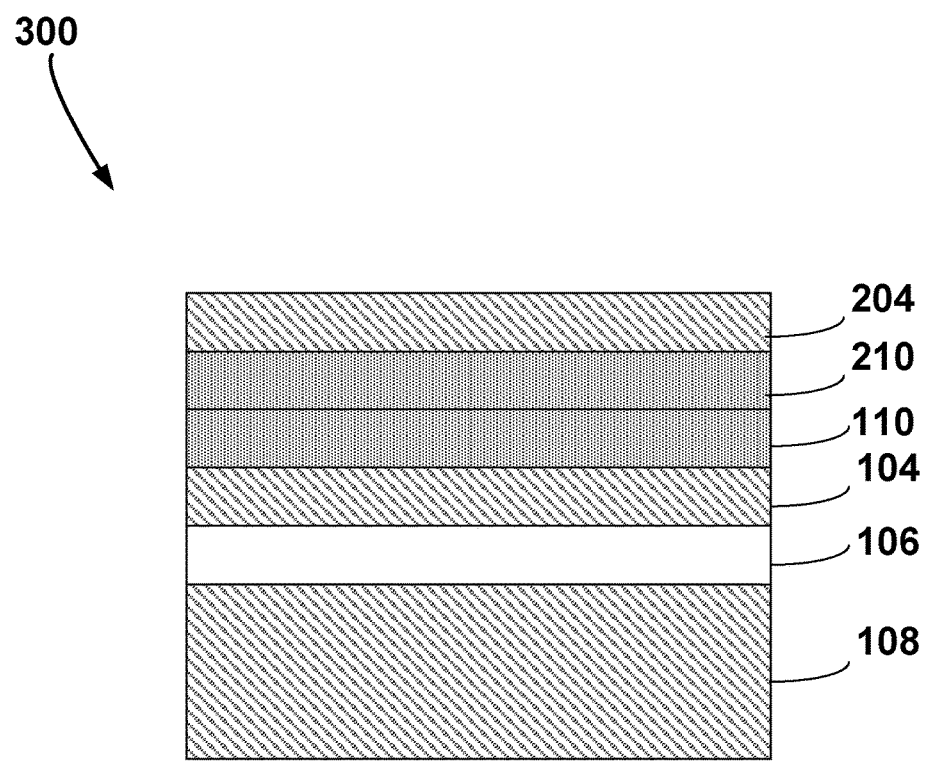
Figure 1F:
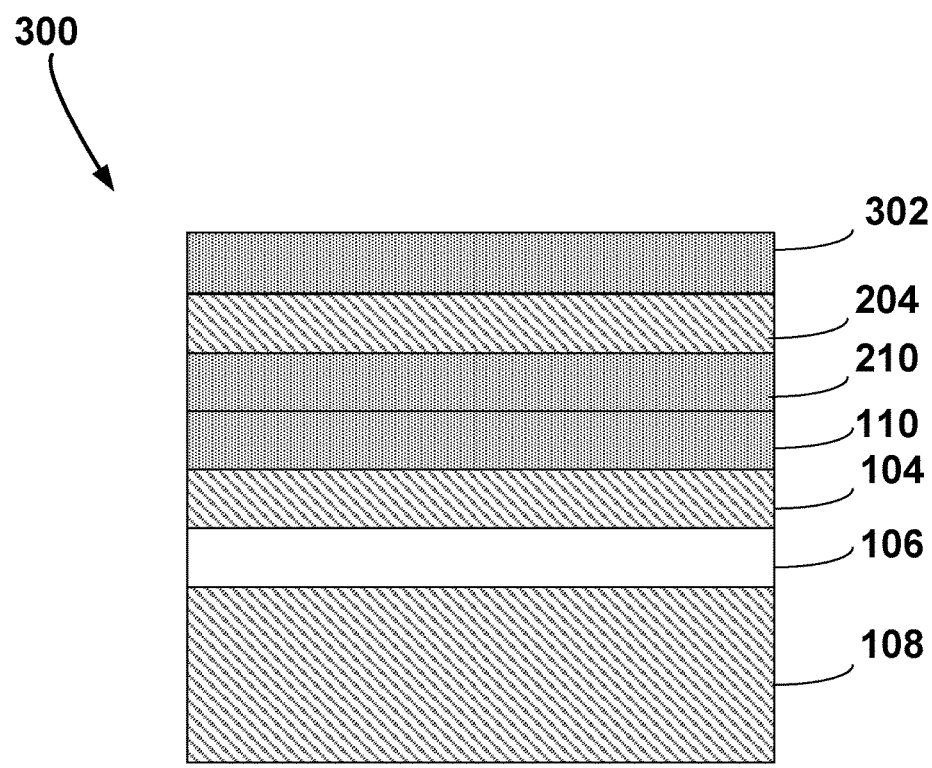
Figure 1G:
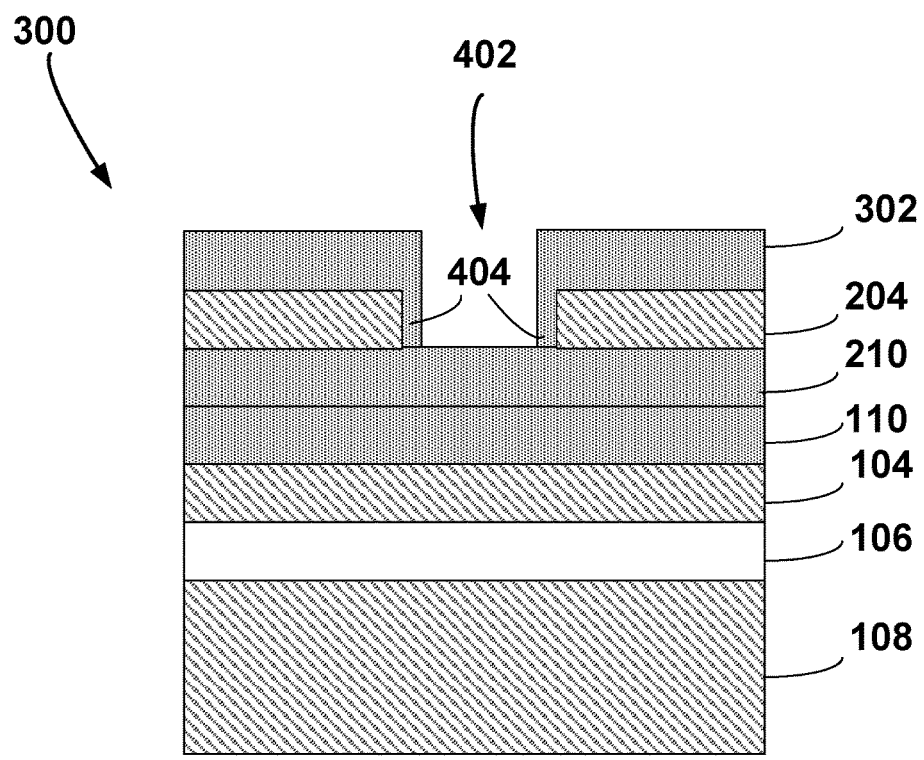
Figure 2:
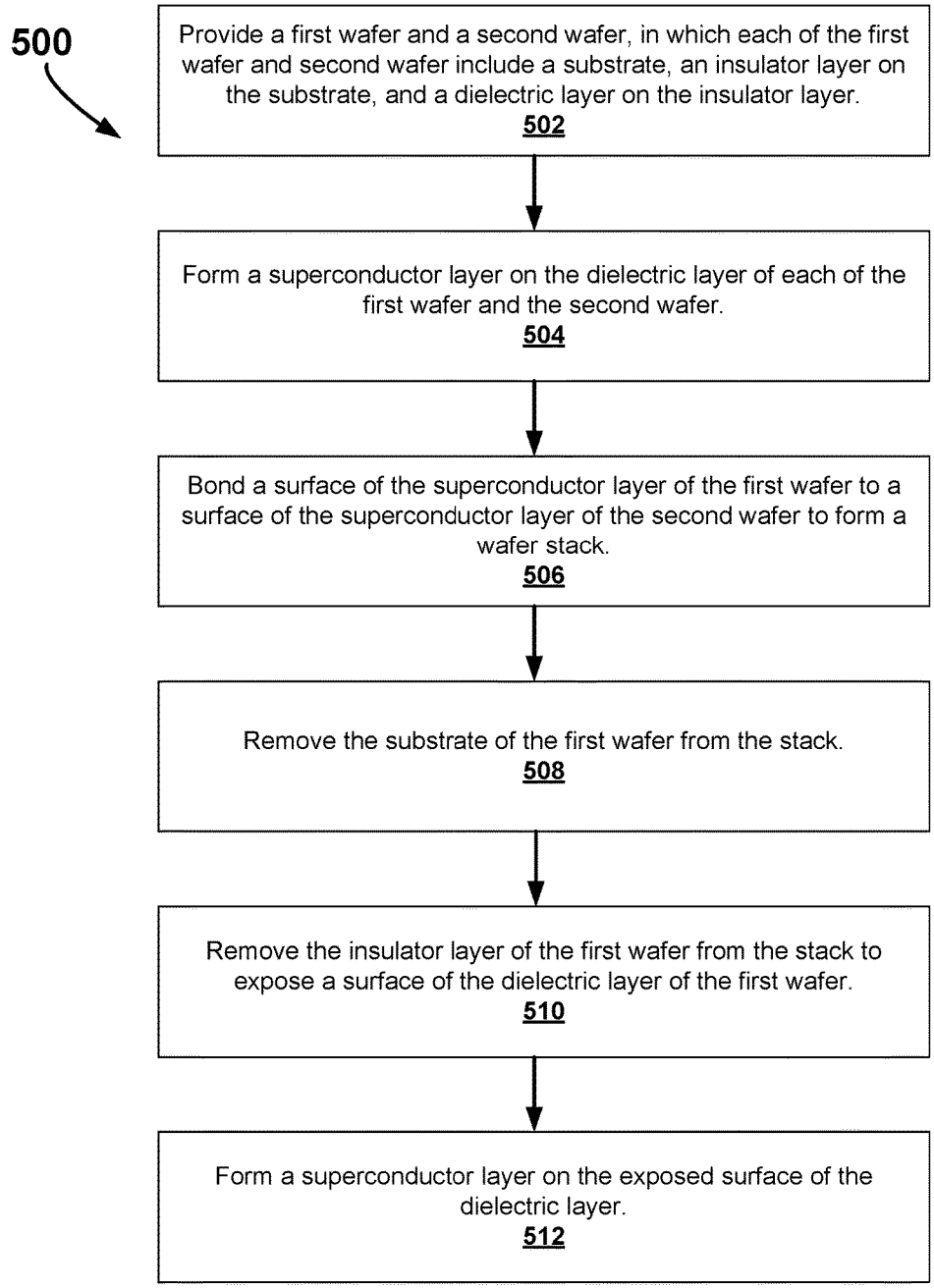
FIG. 2 is a flow chart that illustrates an example process for fabricating interlayer dielectrics.

FIG. 2 is a flow chart that illustrates an example process 500 for fabricating interlayer dielectrics with interfaces having low loss (e.g., associated with high Q when formed as part of a resonator) for quantum computing devices. FIGS. 1A-1G are schematics that illustrate the fabrication process set forth in FIG. 2. The views shown in FIGS. 1A-1G correspond to side views of the fabrication process, in which layers extend into and out of the page. The size of the layers shown in the figures is not intended to be to scale. The process 500 is described with reference to FIGS. 1A-1G as appropriate.

In a first step of the process 500, a first wafer 100 and second wafer 200 are provided (502). FIG. 1A is a schematic that illustrates an example of the first wafer 100. Though not shown, the second wafer 200 has the same structure as the wafer 100 shown in FIG. 1A. The first wafer 100 includes a substrate 108, an insulator layer 106, and a dielectric layer 104. As explained above, dielectric layers that are deposited using standard deposition techniques typically have an amorphous or polycrystalline structure with high loss that is not suitable for use with quantum processors. To avoid such losses, the dielectric layer 104 in this example has a single crystalline structure. For example, the dielectric layer 104 can be un-doped single crystalline Si. The single crystalline dielectric layer 104 may be provided as part of, e.g., a silicon-on-insulator (SOI) wafer. SOI wafers are precisely engineered multilayer semiconductor/dielectric structures that offer reduced parasitic capacitance in the top silicon layer due to the isolation provided the insulation layer on which the top silicon layer is arranged. The insulator layer 106 in an SOI wafer is typically $SiO_2$ or sapphire, whereas the substrate 108 is typically bulk single crystal silicon. In another implementation, the wafer could include a sapphire-on-insulator wafer, in which a Si wafer (serving as the substrate 108) having an oxidized surface (serving as the insulator layer 106) is bonded directly to a sapphire wafer, followed by thinning of the sapphire wafer to form the dielectric layer 104. The substrate 108 also can serve as a handling layer during fabrication that is later removed once the device is finalized. The thickness of the dielectric layer 104 can be in the range of, e.g., about 1 to about 100 microns. The thickness of the insulator layer 106 can be in the range of about, 0.05 to about 10 microns. Other thicknesses for the dielectric layer and insulator layer can be used as well. In general, the process steps described herein are performed at relatively low temperatures (e.g., below approximately 150° C.) such as at an ambient temperature of the manufacturing facility in which the device is fabricated.

Typically, an as-received SOI wafer also includes a thin native oxide layer 102 on the surface of the single crystalline dielectric layer. Before processing the wafer 100, the thin native oxide layer 102 is removed and a cleaning is performed to prepare the surface of the single crystalline dielectric layer 104 and provide a high quality interface. For instance, the wafer 100 may be dipped in HF to remove the native oxide and rinsed with de-ionized (DI) water followed by drying with nitrogen. Before the HF dip, contaminants are removed from the wafer surface. This entails, for example, performing a solvent cleaning with sonication of the surface, followed by either a dry oxygen cleaning method, or a wet cleaning method. For dry oxygen cleaning, numerous techniques can be used such as, e.g., down stream oxygen ashing, ozone, direct plasma cleaning. For wet cleaning, the wafer may be subjected to a piranha etch containing a mixture of sulfuric acid ($H_2SO_4$) and hydrogen peroxide. Following the HF dip, in some implementations, the surface of the single crystalline dielectric layer 104 can again be exposed to an $O_2$ plasma. The second wafer 200 also is prepared by removing a native thin film oxide and by cleaning as described with respect to the first wafer 100.

Next, a superconductor layer is formed on the dielectric layer of each of the first wafer and the second wafer (504). For instance, as shown in FIG. 1B, a layer of superconductor material 110 is deposited on the cleaned surface of the single crystalline dielectric layer 104. The superconductor material 110 is a material that exhibits superconducting properties at or below a superconducting critical temperature, such as aluminum (superconducting critical temperature of 1.2 Kelvin) or niobium (superconducting critical temperature of 9.3 Kelvin). Other superconductor materials may be used instead. A superconductor material also is deposited directly onto the cleaned surface of the single crystalline dielectric layer of the second wafer as well. The deposition can be performed using, e.g., a physical vapor deposition process such as sputtering, thermal evaporation, or e-beam deposition. Other deposition processes may be used instead. The thickness of the deposited superconductor layer 110 can be selected based on the desired end use for the superconductor (e.g., whether the layer 110 will be part of a ground plane, a plate of a capacitor, a routing wire, a microstrip, a resonator, or other component). As an example the thickness of the superconductor layer 100 can range between about 1 nm to about 1 micron, though other thicknesses are also possible.

After depositing the superconductor layer 110 on each of the dielectric layers of the two wafers, the exposed surfaces of superconductor layers 110 are prepared for joining (e.g., bonding). Preparation of the exposed surfaces of the superconductor layers includes performing an ion milling (represented by dashed lines 112 in FIG. 1B) of the superconductor layers 110. Ion milling includes directing ions (e.g., argon ions) at the surface of the superconductor layer 110 at an angle and sputtering material from the surface. For example, in some implementations, ion milling can be performed in an ion milling machine by flowing Ar gas at about 3.6 sccm at a pressure of $3.7*10^{-4}$ mBar, without heat being added (e.g., under an ambient temperature of a manufacturing facility in which the device is being fabricated). It is believed that the ion milling activates the surface structure of the superconductor material to provide improved bonding properties. That is, by removing the native oxide and/or contaminants from the surface of the superconductor using an ion mill, a room temperature or near room temperature wafer bonding can be achieved (e.g., at about an ambient temperature of the manufacturing facility in which the device is fabricated). Because the ion milling process only removes atoms from the surface of the superconductor layer 110, however, the ion milling does not substantially increase the energy loss associated with the surface of the superconductor layer 110.

Following the ion mill activation of the superconductor layers 110 of each wafer, the first wafer 100 and the second wafer 200 are joined (e.g., bonded) together (506), as shown in the example of FIG. 1C to form a wafer stack. As explained above, the second wafer 200 is prepared in the same manner as the first wafer 100 and includes a substrate 208, an insulator layer 206, a single crystalline dielectric layer 204, and a superconductor layer 210. Bonding is performed under a vacuum. The range of pressure for the vacuum can be between approximately $10^{-7}$ Torr to approximately $10^{-9}$ Torr. Bonding may require relatively little pressure. For instance, a few pounds of pressure (for a wafer of approximately 3 inch diameter, e.g., about a few kPa) may be sufficient to obtain an adequate bond between the wafers as in a cold-welding process. For example, to achieve adequate bonding of a first superconductor layer of a first wafer to a second superconductor layer of a second wafer in a wafer stack, such as the stack shown in FIG. 1C, the applied pressure (applied, e.g., in a direction orthogonal to the surfaces being bonded) can be a non-zero pressure that is less than or equal to 1 kPa, less than or equal to 2 kPa, less than or equal to 3 kPa, less than or equal to 4 kPa, less than or equal to 5 kPa, less than or equal to 6 kPa, less than or equal to 7 kPa, less than or equal to 8 kPa, or less than or equal to 9 kPa, among other pressures. In some implementations, however, greater pressure may be applied. The bonding also can be performed at an ambient temperature of the manufacturing facility in which the device is constructed (e.g., in the range of approximately 18° C. and approximately 30° C.). An advantage of performing the bonding without adding heat, is that the formation of hillocks and voids, and the diffusion that would otherwise occur, are absent so that the interface between the single crystalline dielectric layers and the superconductor layers maintains their low loss properties. For example, in some implementations, the loss tangent of the interface between the single crystalline dielectric layer and the superconductor layer can be equal to or less than the bulk loss tangent of the dielectric layer. For instance, the loss tangent of the interface can be less than or equal to $10^{-6}$ (at a temperature of 50 mK and an applied field between 4-6 GHz). In addition, the absence of heat being applied during the bonding process also prevents an increase in loss that would occur at the bonding interface between the superconductor layers 110 and 210. In some implementations, additional heat can be applied during the bonding process if desired. However, the temperature should preferably be kept below approximately 150° C., which is the typical temperature at which the hillocks and/or voids begin to form and diffusion across interfaces increases sufficiently enough to generate noticeable losses at the interfaces between the dielectric and superconductor and between the superconductors. For example, the bonding process can be performed between approximately 18° C. and approximately 150° C., such as between approximately 100° C. and approximately 150° C., between approximately 18° C. and approximately 100° C., or between approximately 18° C. and approximately 30° C. An approximate temperature value can have a measurement uncertainty within plus or minus 1 degree of the stated temperature. The relatively low temperature bonding can be performed using, e.g., the Bond Meister available from Mitsubishi Heavy Industries, Ltd.

After bonding the two wafers together, the handling substrate (e.g., substrate 208) of at least one of the wafers is removed (508) from the wafer stack 300 as shown in FIG. 1D. Though substrate 208 is shown being removed, substrate 108 can be removed instead or in addition to substrate 208. The handling substrate can be removed using a dry or wet etch technique. For instance, if the handling substrate is silicon, the substrate can be removed by applying a $SF_6$ plasma etch or a $XeF_2$ plasma etch. Other dry etches are also possible. Alternatively, for a silicon substrate, the substrate can be removed by applying a KOH wet etch. If the insulating layer 206 is $SiO_2$, then the insulating layer 206 can serve as an etch stop layer for either the dry or wet etch so that it is not necessary to continuously check whether the etch process has been completed. The etch of the handling substrate 208 is preferably performed without adding heat to the etch (e.g., under an ambient temperature of a manufacturing facility in which the device is fabricated) or at a relatively low temperature below 150° C.

Subsequent to removing the handling layer 208, the insulating layer that was located beneath the removed substrate then is removed (510) as shown in the example of FIG. 1E. The insulating layer may be removed using either a dry etch or wet etch. For example, if the insulating layer is $SiO_2$, a wet etch such as an HF dip can be used to remove the insulating layer 206. As with the removal of the handling substrate 208, the insulating layer 206 is preferably etched without adding heat (e.g. under an ambient temperature of the manufacturing facility in which the device is being fabricated) or at a relatively low temperature below approximately 150° C.

After the insulating layer 206 is removed, the now exposed surface of the single crystalline dielectric 204 is cleaned in preparation for deposition of another superconductor layer. For instance, the cleaning step can include applying an $O_2$ plasma to the surface of the dielectric layer 204. Alternatively, or in addition, the cleaning step can include removing oxides using a fluorine chemistry on the surface, so that the surface can be made selective to Al and Si substrate. For instance, the fluorine chemistry can include applying a HF acid dip, exposing the surface to HF vapor, or $XeF_2$ gas, among others Subsequently, another superconductor layer 302 is deposited on the cleaned exposed surface of the dielectric layer 204 (512) as shown in the example of FIG. 1F. The superconductor material can include, e.g., aluminum or niobium, though other superconductor materials are also possible. The superconductor layer 302 can be deposited using a physical vapor deposition technique such as thermal evaporation, sputtering, e-beam deposition. Other deposition techniques may be used instead. The thickness of the deposited superconductor layer 302 can be selected based on the desired end use for the superconductor (e.g., whether the layer 302 will be part of a ground plane, a plate of a capacitor, a routing wire, a microstrip, a resonator, or other component). As an example the thickness of the superconductor layer 302 can range between about 1 nm to about 1 micron, though other thicknesses are also possible. The deposition of the superconductor layer 302 is preferably performed without heat being added (e.g., at an ambient temperature of the manufacturing facility in which the device is formed) or at a relatively low temperature below approximately 150° C. (e.g., a thermal evaporation process may result in residual heat being added to the device as the superconductor is deposited). In some implementations, the substrate 108, insulator layer 106, and/or dielectric layer 104 can be removed depending on device desired. For example, the final device may just include layers of superconductor and interlayer dielectrics to form one or more stacked capacitor devices. Alternatively, in some implementations, the substrate 108 can be retained as a handling wafer if, e.g., further processing is desired.

The process thus described with reference to FIGS. 1A-1F is sufficient to form a simple parallel plate capacitor having a relatively high quality factor Q, in which the last formed superconductor layer 302 is one plate of the capacitor, the silicon layer 204 is the dielectric, and the superconductor layers 110, 210 are the other plate of the capacitor. In some implementations, one or more of the superconductor layers and the dielectric layers can be patterned to form other components that can be used as a quantum device or in a quantum processor. For instance, the processes disclosed herein can be used to form some or all of ground planes, microstrips, resonators, superconducting qubits (e.g., a flux qubit such as a persistent current flux qubit), or routing wires. The processes disclosed herein can be used to form other components of integrated quantum devices as well. Using the fabrication techniques disclosed herein, quantum devices can be produced having an overall quality factor Q for an applied microwave electromagnetic field having a frequency between approximately 4 GHz and approximately 8 GHz (e.g., between approximately 4 GHz and approximately 6.5 GHz) at approximately 50 mK that is greater than about $5*10^6$, such as, e.g., greater than about $1*10^7$, greater than about $5*10^7$, greater than about $1*10^8$, greater than about $5*10^8$, or greater than about $1*10^9$. In some implementations, forming such components may require additional patterning of the wafers before or after bonding. For example, in some implementations, the superconductor layers 110, 210 and dielectric layers 104, 204 of each wafer may be patterned before bonding using lithography and etching techniques as known from classical integrated circuit manufacturing. Alternatively, or in addition, the superconductor layer 302 and/or dielectric layer 204 may be patterned before or after deposition of the superconductor layer 302.

For example, FIG. 1G is a schematic that shows the formation of a through-hole 402 and an interconnect 404 that electrically connects the top superconductor layer 302 to the bottom superconductor layer 210. If the superconductor layer 302 has already been deposited on the surface of the dielectric 204, the through-hole 402 can be formed by removing a selected portion of layer 302 (e.g., using lithography and a metal etch) to create an opening in layer 302. Then the opening in layer 302 is exposed to, e.g., a dry etch such as $SF_6$ to etch the dielectric layer 204 and form the through-hole 402. In this case, the superconductor layer 210 can serve as an etch stop for the $SF_6$ etch. Following formation of the through-hole 402, the superconductor material can be deposited (e.g., using physical vapor deposition as disclosed herein) in the through-hole 402 to form an interconnect 404. The interconnect 404 can form on the sidewalls of the dielectric layer 204 and the surface of layer 302.

In some implementations, the interconnect 404 fills the entirety of the through-hole 402. In some implementations, the dielectric layer 204 can be patterned and etched first to form the through-hole 402. The superconductor material then can be deposited on the surface of the dielectric layer 204 and in the through-hole 402 to form the superconductor layer 302 and the interconnect 404. However, this latter approach would require forming, e.g., a photoresist directly on the dielectric layer 204 in order to define the through-hole area. Such resist can be difficult to completely remove leading to higher losses at the interface between the dielectric and the subsequently deposited superconductor material. An advantage of the techniques disclosed herein is that they allow formation of through substrate vias (TSVs) using superconductors in relatively thick materials. That is, when the aspect ratio (depth to width) is relatively high, TSVs are difficult to form, especially with superconductors, since the openings do not fill properly, leading to poor connectivity. However, by forming the TSV in stages using the presently disclosed techniques, a more reliable TSV may be established. For example, 50 μm thick dielectric layer can be patterned to form a through-hole and filled with a superconductor to establish a 50 μm TSV. Then, the process can be repeated with another 50 μm thick dielectric layer forming a second 50 μm TSV. The two layers can be arranged so the first and second TSV line up with one another followed by bonding of the layers together, such that the two separate 50 μm TSVs form a single 100 μm TSV.

Additional layers and components can be formed and added by repeating the process steps described with respect to FIGS. 1A-1F one or more times. For instance, a third SOI wafer containing a patterned superconductor layer can be prepared, aligned and bonded to the superconductor layer 302 using the techniques as described herein to form additional capacitors, ground planes, wiring, and/or superconductor qubits, among other devices. Though the process set forth herein is described with respect to the fabrication of components for quantum computing systems, the same processes can be used in fabrication of classical circuit components, e.g., CMOS devices, as well. In particular, the processes described herein can be useful for fabricating systems/components where high quality interlayer dielectrics having low loss are desired.

Embodiments of the quantum subject matter and quantum operations described in this specification can be implemented in suitable quantum circuitry or, more generally, quantum computational systems, including the structures disclosed in this specification and their structural equivalents, or in combinations of one or more of them. The term "quantum computational systems" may include, but is not limited to, quantum computers, quantum information processing systems, quantum cryptography systems, or quantum simulators.

The terms quantum information and quantum data refer to information or data that is carried by, held or stored in quantum systems, where the smallest non-trivial system is a qubit, i.e., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

While this specification contains many specific implementation details, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. For example, the actions recited in the claims can be performed in a different order and still achieve desirable results. In certain circumstances, multitasking and parallel processing may be advantageous. Moreover, the separation of various components in the embodiments described above should not be understood as requiring such separation in all embodiments.

Particular embodiments of the subject matter have been described. Other embodiments are within the scope of the following claims.

What is claimed is:

1. A method comprising:
providing a first wafer comprising a first substrate, a first insulator layer on the first substrate, and a first dielectric layer on the first insulator layer;
providing a second wafer comprising a second substrate, a second insulator layer on the second substrate, and a second dielectric layer on the second insulator layer;
forming a first superconductor layer on the first dielectric layer;
forming a second superconductor layer on the second dielectric layer;
joining a surface of the first superconductor layer to a surface of the second superconductor layer to form a wafer stack;
removing at least a portion of the first substrate and the first insulator layer to provide an exposed first surface of the first dielectric layer;
and
forming a third superconductor layer on the exposed first surface of the first dielectric layer.

2. The method of claim 1, further comprising ion milling the surface of the first superconductor layer and the surface of the second superconductor layer prior to joining the surface of the first superconductor layer to the surface of the second superconductor layer.

3. The method of claim 2, wherein joining the surface of the first superconductor layer to the surface of the second superconductor layer comprises bonding the surface of the first superconductor layer to the surface of the second superconductor layer.

4. The method of claim 3, wherein joining the surface of the first superconductor layer to the surface of the second superconductor layer is performed under a vacuum in the range of between approximately $10^{-7}$ Torr to approximately $10^{-9}$ Torr.

5. The method of claim 2, wherein removing at least a portion of the first substrate comprises performing a dry etch of the first substrate after forming the wafer stack.

6. The method of claim 5, wherein performing the dry etch comprises exposing the first substrate to a $SF_6$ or $XeF_2$ plasma, and wherein the first insulator layer serves as an etch stop for the dry etch.

7. The method of claim 2, wherein removing at least a portion of the first substrate comprises performing a wet etch of the first substrate after forming the wafer stack.

8. The method of claim 7, wherein performing the wet etch comprises exposing the first substrate to a solution comprising KOH, and wherein the first insulator layer serves as an etch stop for the wet etch.

9. The method of claim 2, wherein removing at least a portion of the first insulator comprises performing a wet etch of the first insulator layer.

10. The method of claim 9, wherein performing the wet etch of the first insulator layer comprises exposing the first insulator layer to a solution comprising HF, and wherein the first dielectric layer serves as an etch stop for the wet etch.

11. The method of claim 2, further comprising:
prior to forming the first superconductor layer on the first dielectric layer, exposing a second surface of the first dielectric layer, opposite of the first surface of the first dielectric layer, to an $O_2$ plasma; and
prior to forming the second superconductor layer on the second dielectric layer, exposing a first surface of the second dielectric layer to an $O_2$ plasma.

12. The method of claim 2, further comprising:
prior to forming the third superconductor layer, applying an $O_2$ plasma to the exposed first surface of the first dielectric layer.

13. The method of claim 2, further comprising:
forming a through-hole that extends from the third superconductor layer to the first superconductor layer; and
forming a superconductor interconnect in the through-hole that is in contact with the first superconductor layer and the third superconductor layer.

14. The method of claim 13, wherein forming the through-hole comprises performing a $SF_6$ etch of the first dielectric layer, wherein the first superconductor layer serves as an etch stop for the $SF_6$ etch.

15. The method of claim 13, wherein forming the superconductor interconnect in the through-hole comprises depositing a superconductor material by electron-beam deposition or by physical vapor deposition.

16. The method of claim 2, wherein each of the first wafer and the second wafer comprises a silicon-on-insulator stack.

17. The method of claim 2, wherein the first substrate comprises a first single crystal silicon substrate, the first insulator layer comprises a first $SiO_2$ layer or a first sapphire layer, and the first dielectric layer comprises a first silicon layer, and wherein the second substrate comprises a second single crystal silicon substrate, the second insulator layer comprises a second $SiO_2$ layer or a second sapphire layer, and the second dielectric layer comprises a second silicon layer.

18. The method of claim 17, wherein the first silicon layer is a first single crystal silicon layer, and wherein the second silicon layer is a second single crystal silicon layer.

19. The method of claim 2, wherein the first superconductor layer comprises a first aluminum layer, the second superconductor layer comprises a second aluminum layer, and the third superconductor layer comprises a third aluminum layer.

20. The method of claim 2, wherein the third superconductor layer, the first dielectric layer, and the first superconductor layer form a parallel plate capacitor.

21. The method of claim 2, wherein the third superconductor layer forms at least part of a quantum device.

22. The method of claim 21, wherein the quantum device comprises a qubit.

23. The method of claim 1, wherein a loss tangent at the interface between the first dielectric layer and the first superconductor layer and at the interface between the first dielectric layer and the third superconductor layer is less than or equal to a bulk loss tangent of the first dielectric layer.

24. The method of claim 1, further comprising:

prior to forming the first superconductor layer on the first dielectric layer, removing a native oxide layer from a second surface of the first dielectric layer, wherein the second surface is opposite of the first surface of the first dielectric layer, and wherein the first superconductor layer is formed on the second surface of the first dielectric layer; and prior to forming the second superconductor layer on the second dielectric layer, removing a native oxide layer from a first surface of the second dielectric layer, and wherein the second superconductor layer is formed on the first surface of the second dielectric layer.

25. The method of claim 24, wherein removing the native oxide layer from the second surface of the first dielectric layer comprises exposing the second surface of the first dielectric layer to a hydrogen fluoride dip and subsequently performing an oxygen clean on the second surface of the first dielectric layer, and wherein removing the native oxide layer from the first surface of the second dielectric layer comprises exposing the first surface of the second dielectric layer to a hydrogen fluoride dip and subsequently performing an oxygen clean on the first surface of the second dielectric layer.

26. A quantum device comprising:

a dielectric layer having a first surface and a second surface opposite to the first surface; and a first superconductor layer in contact with the first surface of the dielectric layer; and a second superconductor layer in contact with the second surface of the dielectric layer, wherein a loss tangent of an interface between the first surface of the dielectric layer and the first superconductor is equal to or less than a bulk loss tangent of the dielectric layer, and a loss tangent of an interface between the second surface of the dielectric layer and the second superconductor layer is equal to or less than the bulk loss tangent of the dielectric layer.

27. The device of claim 26, wherein the first superconductor layer forms a portion of a qubit, the second superconductor layer forms a portion of a qubit, or the first superconductor layer and the second superconductor layer form a portion of a first qubit and a portion of a second qubit, respectively.

* * * * *